United States Patent [19]
Kang et al.

[11] Patent Number: 5,744,997
[45] Date of Patent: Apr. 28, 1998

[54] SUBSTRATE BIAS VOLTAGE CONTROLLING CIRCUIT IN SEMICONDUCTOR MEMORY DEVICE

[75] Inventors: Bok-Moon Kang; Seung-Moon Yoo, both of Kyungki-do, Rep. of Korea

[73] Assignee: Samsung Electronics, Co., Ltd., Kyungki-do, Rep. of Korea

[21] Appl. No.: 638,484

[22] Filed: Apr. 26, 1996

[30]  Foreign Application Priority Data

Apr. 26, 1995 [KR] Rep. of Korea ............... 9967/1995

[51] Int. Cl.$^6$ ............................................. G05F 1/10
[52] U.S. Cl. ................................. 327/537; 327/534
[58] Field of Search ............................. 327/534, 535, 327/536, 537

[56]  References Cited

U.S. PATENT DOCUMENTS 4,775,959 10/1988 Sato et al. ............................. 365/189
4,961,167 10/1990 Kumanoya et al. ................... 327/534
4,964,082 10/1990 Sato et al. ......................... 365/189.09
5,270,584 12/1993 Koshikawa et al. ................... 327/537
5,506,540 4/1996 Sakurai et al. ....................... 327/534
5,557,221 9/1996 Taguchi et al. ....................... 327/77
5,602,506 2/1997 Kim et al. .......................... 327/535

*Primary Examiner*—Terry Cunningham
*Attorney, Agent, or Firm*—Cushman Darby & Cushman IP Group of Pillsbury Madison & Sutro LLP

[57]  ABSTRACT

A substrate bias voltage controlling circuit controls the generation of different substrate bias voltages according to specific modes. A first sensing signal generator is controlled by the substrate bias voltage and generates a first sensing signal when the level of the substrate bias voltage is higher than a predetermined first potential level. A second sensing signal generator is controlled by the substrate bias voltage and a specific mode signal and generates a second sensing signal when the level of the substrate bias voltage is higher than a predetermined second potential level and when the mode signal is enabled.

3 Claims, 2 Drawing Sheets

5,744,997

SUBSTRATE BIAS VOLTAGE CONTROLLING CIRCUIT IN SEMICONDUCTOR MEMORY DEVICE

BACKGROUND OF THE INVENTION

1. Field of the Invention

The present invention relates to a substrate bias voltage controlling circuit for a semiconductor memory device and, more particularly, to a substrate bias voltage controlling circuit capable of controlling a substrate bias voltage in accordance with an operating mode of the device.

2. Description of the Related Art

A substrate bias voltage, having a negative voltage level for example, is generally used in a semiconductor memory device in order to improve a punch-through characteristic, improve a latch-up characteristic, adjust a threshold voltage, or increase a data margin due to a reduction in bit line capacitance. FIG. 1 is a block diagram illustrating a substrate bias voltage controlling circuit in a semiconductor memory device, which is comprised of a substrate bias voltage sensor 11, an oscillator 12 and a charge pump circuit 13. In FIG. 1, the substrate bias voltage sensor 11 receives as an input a substrate bias voltage VBB, senses the level of the substrate bias voltage VBB and generates a voltage sensing signal PIENB. The oscillator 12 inputs the voltage sensing signal PIENB, is enabled by a period that the voltage sensing signal PIENB is enabled and accordingly, generates an oscillating pulse PIOSC. The charge pump circuit 13 inputs the oscillating pulse PIOSC, performs charging and pumping operations in accordance with a logic state of the oscillating pulse PIOSC and accordingly, generates the substrate bias voltage VBB.

FIG. 2 is a block diagram illustrating a conventional substrate bias voltage sensor 11 of a substrate bias voltage controlling circuit according to FIG. 1. Referring to FIG. 2, a PMOS transistor 21 is connected between a power supply voltage VCC and an output node N1, and its gate electrode is coupled to a ground voltage VSS. PMOS transistors 22 and 23 are serially connected between the output node N1 and a drain electrode of an NMOS transistor 24, and their gate electrodes are commonly coupled to the substrate bias voltage VBB. The NMOS transistor 24 is connected between a drain electrode of the PMOS transistor 23 and the ground voltage VSS, and its gate electrode is coupled to the power supply voltage VCC. Inverters 25 and 26, which are serially connected between the output node N1 and the oscillator 12, perform a function of outputting the voltage sensing signal PIENB.

An explanation of an operation of the conventional substrate bias voltage sensor will be given now in detail. With respect to FIG. 2, the ground voltage VSS causes PMOS transistor 21 to conduct and generate the power supply voltage VCC to the output node N1. Also, the NMOS transistor 24 is caused to conduct by application of the power supply voltage VCC to its gate electrode.

Since the PMOS transistors 22 and 23 have their gate electrodes commonly coupled to the substrate bias voltage VBB, the PMOS transistors 22 and 23 are caused to conduct according to the level of the substrate bias voltage VBB. That is, if the level of the substrate bias voltage VBB is lower than a predetermined voltage level, the PMOS transistors 22 and 23 conduct more than a previous state, thereby enabling a potential of the output node N1 to drop. To the contrary, if the level of the substrate bias voltage VBB is higher than the predetermined voltage level, the PMOS transistors 22 and 23 conduct less than the previous state, thereby enabling the potential of the output node N1 to increase. Accordingly, the PMOS transistors 22 and 23 set a reference level of the substrate bias voltage VBB.

The potential of the output node N1 is thus determined by the channel resistances of PMOS transistors 21 to 23 and NMOS transistor 24. PMOS transistor 21 and NMOS transistor 24 each have a fixed channel resistance, but PMOS transistors 22 and 23 have channel resistances which vary in accordance with a variation of the substrate bias voltage VBB. Consequently, if the substrate bias voltage VBB becomes higher than the predetermined level, the potential of the output node N1 is increased. On the other hand, if the substrate bias voltage VBB becomes lower than the predetermined level, the potential of the output node N1 drops. The potential of the output node N1 detected as described above is determined according to a trip voltage of the inverter 25, and then generated as the voltage sensing signal PIENB which is inputted as a control signal of the oscillator 12. In particular, when the voltage of the output node N1 is higher than the trip voltage of the inverter 25, the voltage sensing signal PIENB is enabled. Meanwhile, when the voltage of the output node N1 is lower than the trip voltage of the inverter 25, the voltage sensing signal PIENB is disabled.

The conventional substrate bias voltage controlling circuit operates identically to control the substrate bias voltage VBB regardless of the operating mode of the semiconductor memory device. However, for example, in a dynamic random access memory (hereinafter, referred to as DRAM), a self refresh mode is performed periodically lest information stored in memory cells is lost. In the self refresh mode, a substantive refresh operation is not performed during the overall mode period, but only within a specific timing interval of the overall mode period. When the substrate bias voltage VBB is detected in the manner described above, even during an interval where the normal mode is not performed, the substrate bias voltage VBB is controlled and current is unnecessarily consumed.

Furthermore, if the substrate bias voltage VBB becomes low during a refresh operation (i.e., if an absolute value of the substrate bias voltage VBB is increased), a junction leakage current is relatively increased, thereby deteriorating a refresh feature. To the contrary, if the substrate bias voltage VBB becomes high (i.e., if the absolute value of the substrate bias voltage VBB is decreased), the consumption of the junction leakage current can be prevented, thereby improving the refresh characteristic.

Therefore, there is a need in the art for a substrate bias voltage controlling circuit for a semiconductor memory device which adjusts the level of the substrate bias voltage differently in accordance with an operating mode. The present invention fulfills this need.

SUMMARY OF THE INVENTION

It is therefore an object of the present invention to provide a substrate bias voltage controlling circuit for a semiconductor memory device which controls the generation of a substrate bias voltage according to mode-specific intervals, such as a stand-by mode or a self refresh mode, to reduce unnecessary current consumption.

It is another object of the present invention to provide a substrate bias voltage controlling circuit for a semiconductor memory device which generates a substrate bias voltage having a higher potential during a self refresh operation than during a normal mode, in order to prevent generation of a junction leakage current and to improve a refresh characteristic.

These and other objects can be achieved according to the present invention which provides a substrate bias voltage controlling circuit for controlling generation of different substrate bias voltages according to specific modes. A first sensing signal generator is controlled by the substrate bias voltage and generates a first sensing signal when the level of the substrate bias voltage is higher than a predetermined first potential level. A second sensing signal generator is controlled by the substrate bias voltage and a specific mode signal and generates a second sensing signal when the level of the substrate bias voltage is higher than a predetermined second potential level and when the mode signal is enabled.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements devices, and wherein.

DETAILED DESCRIPTION OF THE PREFERRED EMBODIMENT

In the following description, the first sensing signal PIENB denotes a signal which is generated when the level of a substrate bias voltage VBB is higher than a predetermined first potential level, the substrate bias voltage VBB being generated during a normal mode. The second sensing signal PIENB denotes a signal which is generated within a refresh operation interval of a self refresh mode when the level of the substrate bias voltage VBB is higher than a predetermined second potential level.

Figure 1:
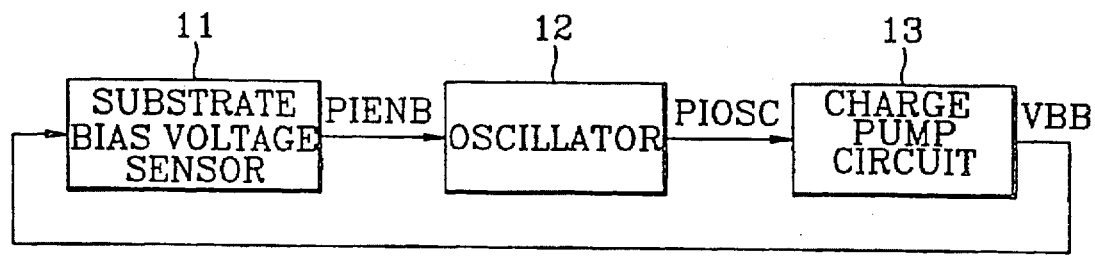
FIG. 1 is a block diagram illustrating a substrate bias voltage controlling circuit for a semiconductor memory device.
Figure 2:
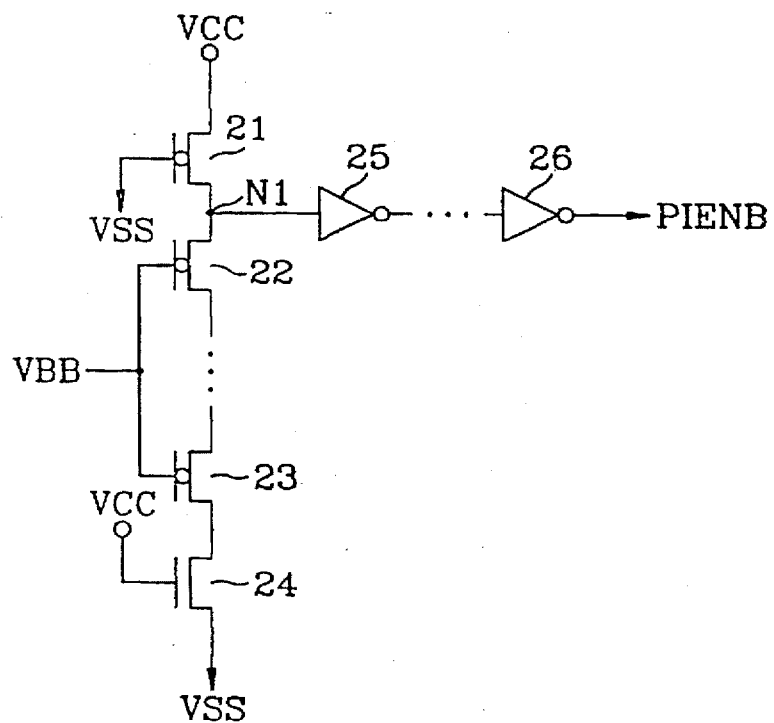
FIG. 2 is a circuit diagram illustrating a conventional substrate bias voltage sensor for a circuit of FIG. 1.
Figure 3:
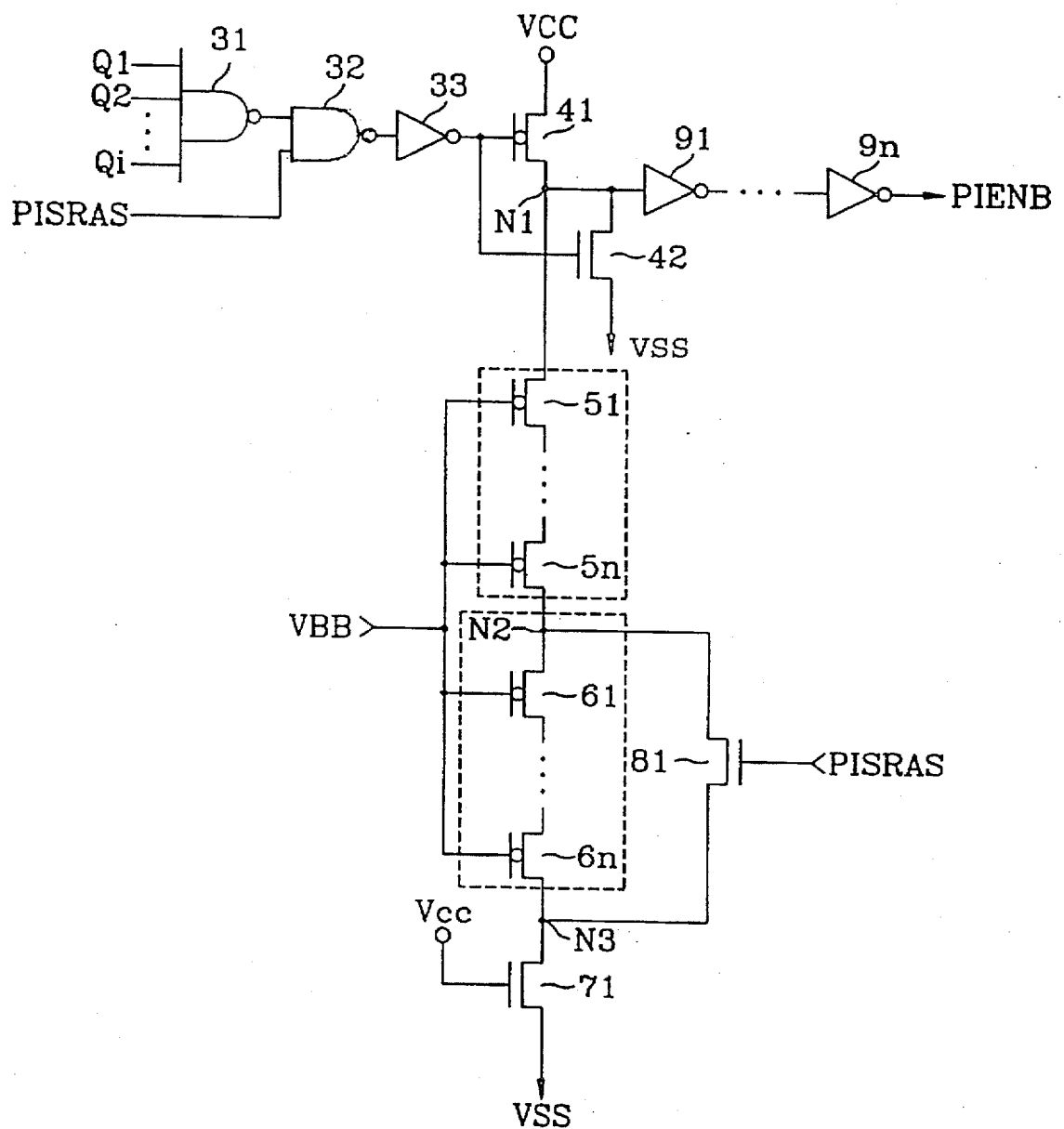
FIG. 3 is a circuit diagram illustrating a substrate bias voltage controlling circuit constituted according to the principles of the present invention.

FIG. 3 is a circuit diagram illustrating a substrate bias voltage controlling circuit which is constituted according to the principles of the present invention. As shown in FIG. 3, a NAND gate 31 inputs counting signals Q1–Qi outputted from a self refresh counter. Herein, the counting signals Q1–Qi are all inputted as high logic level signals only during a timing interval where a refresh operation is performed within a period of a self refresh mode. The NAND gate 31 outputs a low logic level signal only when all of the counting signals Q1–Qi are high logic level signals.

NAND gate 32 inputs an output of the NAND gate 31 and a self refresh master clock PISRAS. Herein, the self refresh master clock PISRAS is generated as the high logic level signal during the self refresh mode and as the low logic level signal during modes other than the self refresh mode. Therefore, NAND gate 32 outputs the high logic level signal when the self refresh master clock PISRAS is outputted as the low logic level signal (that is, during all operating modes except the self refresh mode) or when NAND gate 31 outputs the low logic level signal while the self refresh master clock PISRAS is enabled to the high logic state (that is, within the specific interval when the refresh operation is performed during the self refresh mode). In the meantime, NAND gate 32 outputs the low logic level signal when NAND gate 31 outputs the high logic level signal while the self refresh master clock PISRAS is in the high logic state (that is, when the refresh operation is not performed during the self refresh mode).

An inverter 33 inverts an output of the NAND gate 32. The constitution of the above described three components thus plays a role of enabling or disabling an operation of sensing the substrate bias voltage VBB.

As further shown in FIG. 3, PMOS transistor 41 is connected between a power supply voltage VCC and an output node N1, and its gate electrode is coupled to the output of the inverter 33. As a first switching means, PMOS transistor 41 is switched on in all modes other than the self refresh mode or within the timing interval during which the refresh operation is performed during the self refresh mode, so that a path between the power supply voltage VCC and the output node N1 can be formed. Meanwhile, the PMOS transistor 41 is switched off in intervals of the self refresh mode when the refresh operation is not performed, so that the path between the power supply voltage VCC and the output node N1 can be closed, thereby interrupting the function of sensing the substrate bias voltage VBB.

NMOS transistor 42 is connected between the output node N1 and the ground voltage VSS, and its gate electrode is coupled to the inverter 33. As a sixth switching means, the NMOS transistor 42 is switched off in modes other than the self refresh mode or within the timing interval in which the refresh operation is performed during the self refresh mode, so that a connection between the output node N1 and the ground voltage VSS can be closed. To the contrary, the NMOS transistor 42 is switched on when the refresh operation is not performed during the self refresh mode, so that the output node N1 and the ground voltage VSS are connected, thereby charging/discharging the potential of the output node N1.

Inverters 91–9n coupled between the output node N1 and the oscillator 12 invert the sensing signal PIENB of the substrate bias voltage VBB sensed at the output node N1 into a CMOS level signal. In this case, the inverters 91–9n serve as output means.

PMOS transistors 51–5n are serially connected between the output node N1 and a first connecting node N2, and their gate electrodes are commonly coupled to the substrate bias voltage VBB. The PMOS transistors 51–5n serve as a second switching means and their combined channel resistance is used to set both a first potential level and a second potential level, which enables different sensing levels of the substrate bias voltage VBB in accordance with a mode.

PMOS transistors 61–6n are serially connected between the first connecting node N2 and the second connecting node N3, and their gate electrodes are commonly coupled to the substrate bias voltage VBB. The PMOS transistor 61–6n serve as a third switching means and their combined channel resistance is used to set the first potential level used during the normal mode.

NMOS transistor 71 serves as a fourth switching means and its channel resistance is used to set both the first potential level and the second potential level used to adjust the sensing level of the substrate bias voltage VBB in accordance with the mode.

NMOS transistor 81 is connected between the first connecting node N2 and the second connecting node N3, and its gate electrode is coupled to the self refresh master clock PISRAS. The NMOS transistor 81 serves as a fifth switching means and its channel resistance is used to set only second potential level used during the self refresh mode.

Therefore, during the normal mode, the first potential level for setting the level of the substrate bias voltage VBB is set by the PMOS transistors 41, 51–5n, 61–6n and the NMOS transistor 71. The first potential level sets a threshold for generating the first sensing signal PIENB. Likewise, during the self refresh mode, the second potential level for setting the level of the substrate bias voltage VBB is set by the PMOS transistors 41, 51–5n, 61–6n, the NMOS transistors 71 and 81, and the second potential level sets the threshold for generating the second sensing signal PIENB during the self refresh mode. Moreover, inasmuch as the first potential level is set to be higher than the second potential level, an absolute value of the substrate bias voltage VBB generated during the normal mode is higher than that of the substrate bias voltage VBB generated during the self refresh mode.

Upon generating the substrate bias voltage VBB, the present invention interrupts an operation of generating the substrate bias voltage VBB in states where the substrate bias voltage VBB is not used and generates different levels of the substrate bias voltage VBB in accordance with the mode. Namely, in the DRAM, after being enabled, the self refresh mode performs the refresh operation within the specific interval. The refresh operation is not performed in the refresh mode except within the specific interval and accordingly, unnecessary current drawn by the VBB generator may be consumed.

In addition, if the absolute value of the substrate bias voltage VBB becomes large, the junction leakage current also becomes large, thereby deteriorating the refresh characteristic. As a result, the substrate bias voltage controlling circuit according to the present invention curtails the generation of the substrate bias voltage VBB in intervals when the self refresh operation is not performed during the self refresh mode. On the other hand, the above circuit generates the substrate bias voltage VBB (whose absolute value is less than the absolute value of the substrate bias voltage VBB during the normal mode) higher than the substrate bias voltage VBB within the specific interval when the refresh operation is performed.

First of all, during normal mode operations, the self refresh master clock PISRAS is inputted in the low logic state. Thus, NMOS transistor 81, having its gate electrode connected to the self refresh mode clock PISRAS, is switched off. Also, NAND gate 32 outputs a high logic level signal and inverter 33 outputs a low logic level signal. Then, since PMOS transistor 41 and NMOS transistor 42 respectively have their gate electrodes commonly connected to the output node of the inverter 33, PMOS transistor 41 is turned on and NMOS transistor 42 is turned off.

Therefore, since PMOS transistors 51–5n and 61–6n are control the level of the substrate bias voltage VBB, the potential sensed, which depends on the level of the substrate bias voltage VBB, is generated to the output node N1. Here, the level of the substrate bias voltage required during the normal mode is capable of being set by adjusting the channel resistances of the PMOS transistors 41, 51–5n, 61–6n, and the NMOS transistor 71. That is, the first potential level for setting the substrate bias voltage VBB required during the normal mode can be determined. As a result, during the normal mode, the current path passed through the PMOS transistors 41, 51–5n, 61–6n and the NMOS transistor 71 is formed according to the substrate bias voltage VBB. Then, if the substrate bias voltage has a negative voltage level above that of the first potential level set by the channel resistances of the MOS transistors (i.e., in the event that the absolute value of the substrate bias voltage VBB is large), the PMOS transistors 51–5n and 61–6n conduct more, thereby causing the potential of the output node N1 to drop. In addition, if the substrate bias voltage VBB has a negative voltage level lower than that of the first potential level set by the channel resistances of the MOS transistors (i.e., in the event that the absolute value of the substrate bias voltage VBB is small), the PMOS transistors 51–5n and 61–6n conduct less, thereby causing the potential of the output node N1 to rise.

The potential of the output node N1 generated as mentioned previously becomes the first sensing signal PIENB of the substrate bias voltage VBB inputted to the oscillator 12 through the inverters 91–9n. The oscillator 12 enables the oscillation operation depending on the first sensing signal PIENB and generates the oscillating pulse PIOSC, and the charge pump circuit 13 performs the charging and pumping operations by the oscillating pulse PIOSC and then generates the substrate bias voltage VBB.

Secondly, during the self refresh mode, the self refresh master clock PISRAS is inputted as a high logic level signal. Here, NMOS transistor 81 turns on and NAND gate 31 inputs the counting signals Q1–Qi of the self refresh counter. The counting signals are generated as high logic level signals within the interval when the refresh operation is performed during the self refresh mode.

To the contrary, in remaining intervals when the refresh operation is not performed, NAND gate 31 outputs the high logic level signal. In this case, NAND gate 32 outputs the low logic level signal and inverter 33 outputs the high logic level signal. Accordingly, PMOS transistor 41 turns off and NMOS transistor 42 turns on. Eventually, the path between the power supply voltage VCC and the output node N1 is closed and the charge at the output node N1 is discharged through the NMOS transistor 42; accordingly, the sensing operation of the substrate bias voltage VBB is disabled. Therefore, the operation of generating the substrate bias voltage VBB is interrupted in intervals when the refresh operation is not performed during the self refresh mode. Hence, the substrate bias voltage controlling circuit prevents unnecessary generation of the substrate bias voltage and unnecessary current consumption.

As described above, once performance of the refresh operation begins during the self refresh mode, all of the counting signals Q1–Qi are inputted as high logic level signals. Thus, NAND gate 31 outputs a low logic level signal, NAND gate 32 outputs a high logic level signal and inverter 33 outputs a low logic level signal. Further, PMOS transistor 41 turns on and NMOS transistor 42 turns off. Once PMOS transistor 41 turns on, the power supply voltage VCC is supplied to the output node N1. Here, in comparison with the channel resistances of PMOS transistors 61–6n, the channel resistance of NMOS transistor 81 is relatively small.

Furthermore, the current path during the self refresh mode is shaped through PMOS transistors 41, 51–5n, NMOS transistors 81 and 71. The second potential level for setting the substrate bias voltage VBB during the self refresh mode can be adjusted by the combined channel resistances of PMOS transistors 41, 51–5n, and NMOS transistors 81 and 71. Since NMOS transistor 81 is conducting and PMOS transistors 51–5n are controlled according to the level of the substrate bias voltage VBB, the potential sensed as the level of the substrate bias voltage VBB is generated. Because the PMOS transistors 51–5n are controlled by the substrate bias voltage VBB, the channel resistance during the refresh mode is lower than during the normal mode. Therefore, the current flowing through the current path formed by the PMOS transistors 41, 51-5n, the NMOS transistors 81 and 71, and the current flowing through the current path formed during the normal mode can be ignored. If the level of the substrate bias voltage VBB is lower than the second potential level set by the channel resistances of the MOS transistors, the PMOS transistors 51-5n conduct more, so that the potential of the output node N1 drops. To the contrary, if the level of the substrate bias voltage is higher than the second potential level set by the channel resistances of the MOS transistors, the PMOS transistors 51-5n are conduct less, so that the potential of the output node N1 can increase.

As stated hereinbefore, the potential of the output node N1 becomes the second sensing signal PIENB of the substrate bias voltage VBB inputted to the oscillator 12 through the inverters 91-9n. Then, oscillator 12 enables the oscillation operation according to the second sensing signal PIENB, and generates the oscillating pulse PIOSC. Charge pump circuit 13 performs the charging and pumping operations according to the oscillating pulse PIOSC to generate the substrate bias voltage VBB.

Accordingly, the present invention has an advantage in that since the absolute value of the substrate bias voltage VBB due to the second sensing signal PIENB generated during the refresh mode is smaller than that of the substrate bias voltage VBB generated during the normal mode, the refresh characteristic can be improved.

Although the present invention has been described with reference to the preferred embodiments thereof, those skilled in the art will readily appreciate that various substitutions and modifications can be made thereto without departing from the spirit and scope of the invention as set forth in the appended claims.

What is claimed is:

1. A circuit for controlling a substrate bias voltage of a semiconductor memory device operable in normal and self-refresh modes, said circuit being responsive to sensing of the substrate bias voltage and comprising:

mode signal generating means operative when said memory is in the self-refresh mode, and interval signal generating means operative during a portion of the self-refresh mode;

a sensing controller responsive to said mode and interval signals, said controller generating a first logic signal when said mode and interval signals are applied to the controller, and when no mode signal is applied to the controller, and generating a second logic signal when only a mode signal is applied to said controller;

a first switch connected between a power terminal and an output node, said first switch additionally being joined to said controller whereby when the first logic signal is applied to the switch, the switch is operative to couple a voltage level at the power terminal to said output node;

a second switch including at least one switching component, said second switch being connected between said output node and a first connecting node, said switching component having a control terminal to which said substrate bias voltage is applied;

a third switch including at least one switching component, said third switch being connected between said first connecting node and a second connecting node, said switching component of the third switch having a control terminal to which said substrate bias voltage also is applied;

a fourth switch connected between said second connecting node and a reference terminal and having a control terminal connected to said power terminal;

a fifth switch connected between said first and second connecting nodes and having a control terminal to which said mode signal generating means is applied, said fifth switch being operative in response to said mode signal;

a sixth switch connected between said output node and said reference terminal and having a control terminal connected to an output of said sensing controller, said sixth switch being operative in response to said second logic signal to cause voltage at said output node to discharge to a voltage level different from the voltage level at the power terminal; and a sensing signal output circuit connected to said output node for producing a sensing signal for generating said substrate bias voltage, said sensing signal output circuit being disabled when said sixth switch is operative;

said substrate bias voltage controlling circuit being operative whereby in the absence of a mode signal said first, second, third and fourth switches establish a first potential level for adjusting the substrate voltage bias, and when said mode signal is applied to the substrate bias voltage controlling circuit said first, second, fourth and fifth switches establish a second potential level for adjusting the substrate voltage bias.

2. The circuit according to claim 1, wherein when said interval signal generating means is operative, a refresh operation is performed on the memory device.

3. A circuit according to claim 1, wherein said first switch and said second switch are PMOS transistors, said third switch and said fourth switch are NMOS transistors, and wherein said power terminal is coupled to a power supply voltage and said reference terminal is coupled to ground voltage.

* * * * *